(12) United States Patent
Zurowski et al.

(10) Patent No.: US 10,518,717 B2
(45) Date of Patent: Dec. 31, 2019

(54) VIDEO-CAMERA DEVICE FOR A MOTOR VEHICLE AND ASSEMBLY METHOD

(71) Applicant: Aptiv Technologies Limited, St. Michael (BB)

(72) Inventors: Miroslaw Zurowski, Cracow (PL); Slawomir Jarczok, Cracow (PL); Przemyslaw Antos, Skawina (PL)

(73) Assignee: Aptiv Technologies Limited (BB)

( * ) Notice: Subject to any disclaimer, the term of this patent is extended or adjusted under 35 U.S.C. 154(b) by 53 days.

(21) Appl. No.: 15/817,506

(22) Filed: Nov. 20, 2017

(65) Prior Publication Data

US 2018/0147999 A1 May 31, 2018

(30) Foreign Application Priority Data

Nov. 25, 2016 (FR) ..................... 16 61502

(51) Int. Cl.
*B60R 11/04* (2006.01)
*H04N 5/225* (2006.01)
*H05K 1/14* (2006.01)
*H05K 3/36* (2006.01)
*B60R 11/00* (2006.01)

(52) U.S. Cl.
CPC .......... *B60R 11/04* (2013.01); *H04N 5/2251* (2013.01); *H04N 5/2252* (2013.01); *H04N 5/2253* (2013.01); *H04N 5/2257* (2013.01); *H05K 1/148* (2013.01); *H05K 3/366* (2013.01);

(Continued)

(58) Field of Classification Search
CPC ........ B60R 11/04; H04N 5/2257; H05K 1/14; H05K 3/36
See application file for complete search history.

(56) References Cited

U.S. PATENT DOCUMENTS 9,596,387 B2   3/2017   Achenbach et al.
2009/0085755 A1*  4/2009   Schafer ................... B60R 11/04
                                                340/602

(Continued)

FOREIGN PATENT DOCUMENTS

CN   103858425 A      6/2014
DE   10237606 A1 *  3/2004  ............ B60R 11/04

(Continued)

*Primary Examiner* — Mainul Hasan
(74) *Attorney, Agent, or Firm* — Joseph V. Bonadies

(57) ABSTRACT

A video-camera device comprises a motherboard, and a daughterboard comprising a video-camera module the optical axis of which is perpendicular to a main plane of the daughterboard. The motherboard includes a rigid main segment comprising image-processing electronic components. The motherboard including a secondary segment made of the same material as, and integrally formed with, the main segment. The secondary segment is partially surrounded by a void. The secondary segment has a rectilinear border defining the junction between the main segment and the secondary segment. The rectilinear border defines a pivot axis of the secondary segment. The daughterboard is mounted perpendicularly on the secondary segment in such a way that the secondary segment is inclinable relative to the surface of the main segment about the pivot axis in order to allow the angle of inclination between the optical axis of the video-camera module and the main segment to be adjusted.

8 Claims, 3 Drawing Sheets

(52) U.S. Cl.
CPC ............... *B60R 2011/0026* (2013.01); *B60R 2011/0063* (2013.01); *B60R 2011/0077* (2013.01)

(56) References Cited

U.S. PATENT DOCUMENTS

| | | |
|---|---|---|
| 2014/0160284 A1 | 6/2014 | Achenbach et al. |
| 2015/0015713 A1* | 1/2015 | Wang .................. H04N 7/18 348/148 |
| 2017/0182944 A1 | 6/2017 | Achenbach et al. |

FOREIGN PATENT DOCUMENTS

| | | |
|---|---|---|
| GB | 2 527 117 A | 12/2015 |
| WO | 2013/123161 A1 | 8/2013 |

* cited by examiner

VIDEO-CAMERA DEVICE FOR A MOTOR VEHICLE AND ASSEMBLY METHOD

CROSS-REFERENCE TO RELATED APPLICATION

This application claims the benefit under 35 U.S.C. § 119(a) of European Patent Application FR1661502, filed 25 Nov. 2016, the entire disclosure of which is hereby incorporated herein by reference.

TECHNICAL FIELD OF INVENTION

The present invention relates to a video-camera device for monitoring the field of view in front of a motor vehicle.

BACKGROUND OF INVENTION

In vehicles, video-camera devices are sometimes installed on the windscreen, in proximity to the central mirror, in the upper middle portion of the windscreen. Such a location allows the system a wide and unobstructed field of view.

Video-camera devices generally include a video-camera-module portion comprising the lens and the image sensor of the video camera, the module being arranged on a first printed-circuit board so that the optical axis of the lens is perpendicular to the printed-circuit board. Video-camera devices generally also include a portion for processing images and interfacing with the vehicle, this portion being arranged on a second printed-circuit board.

One of the most common requirements made of these video-camera devices is that the main optical axis be parallel to the longitudinal axis of the vehicle.

Because of this requirement, the printed-circuit board is placed perpendicular to the longitudinal axis of the vehicle so that the optical axis of the video camera is parallel to the longitudinal axis of the vehicle.

The image processing of video-camera systems is carried out on a printed-circuit board that is much larger and more complex than the printed-circuit board comprising the image sensor. The tendency of integration requirements is to decrease the size of on-board video-camera systems.

It is known to design video-camera systems in which the printed-circuit board on which the image processing is carried out is arranged inclined by up to about a few tens of degrees to the longitudinal axis of the vehicle. This generally results in the printed-circuit board including the image sensor being connected to the printed-circuit board carrying out the image processing with a flexible ribbon cable. Such an assembly of three elements in a small environment is a complex and expensive operation.

It is therefore important to provide a novel solution solving these problems.

SUMMARY OF THE INVENTION

A video-camera device comprises a motherboard that is rectangular overall, and a daughterboard comprising a video-camera module the optical axis of which is perpendicular to the main plane of the daughterboard. The motherboard includes a rigid main segment comprising image-processing electronic components. The motherboard includes a secondary segment that is made of the same material as and integrally formed with the main segment. The secondary segment is partially surrounded by a void. The secondary segment has a rectilinear border defining the junction between the main segment and the secondary segment, the rectilinear border defining a pivot axis of the secondary segment. The daughterboard is mounted perpendicularly on the secondary segment. Thus, the secondary segment is inclinable relatively to the surface of the main segment about the pivot axis in order to allow the angle of inclination between the optical axis of the video-camera module and the main segment to be adjusted.

Preferably, the optical axis may be perpendicular to the pivot axis. The secondary segment may comprise an intermediate segment and a connecting segment; the intermediate segment extending between the rectilinear border and the connecting segment. The intermediate segment may have a reduced thickness with respect to the thickness of the main segment. Thus, the inclination of the secondary segment with respect to the main segment may be facilitated in particular when the daughterboard is arranged on the connecting segment. The intermediate segment may also have a reduced thickness with respect to the thickness of the connecting segment.

Preferably, the secondary segment may be bounded by at least one slot extending from a rectilinear edge of the motherboard to the pivot axis of the secondary segment. The secondary segment may be bounded by two slots on either side of the secondary segment, the two slots extending from the rectilinear edge of the motherboard to the pivot axis of the secondary segment.

The video-camera device may be configured to be mounted in the passenger compartment of a vehicle, on the windscreen of the vehicle. The video-camera device may include a housing assembly comprising a bottom wall and an upper cover. The motherboard may be fastened flat to the bottom wall of the housing. The video-camera module may be fastened to the upper cover. Thus, the secondary segment of the motherboard is inclined at an angle α relatively to the surface of the main segment about the pivot axis.

A method for assembling a video-camera device includes the steps of: providing a motherboard that is rectangular on the whole, including a rigid main segment and a secondary segment that is partially surrounded by a void, and having a rectilinear border defining a junction between the main segment and the secondary segment, the rectilinear border defining a pivot axis of the secondary segment so that the secondary segment is inclinable relatively to the surface of the main segment about the pivot axis; producing a connecting segment on the secondary segment, intended for connection of a daughterboard; providing a daughterboard comprising a video-camera module the optical axis of which is perpendicular to the main plane of the daughterboard; providing a housing assembly including an upper cover and a lower housing; fastening the video-camera module to the upper cover; assembling the motherboard and the daughterboard by connecting the daughterboard orthogonally to the connecting segment; assembling the lower housing with the upper cover so as to close the housing assembly; and fastening flat the motherboard to the bottom wall of the lower housing, the optical axis of the video-camera module being inclined by an angle α relatively to the surface of the main segment of the motherboard.

Preferably, the steps of fastening the motherboard and the video-camera module are screw-fastening steps.

BRIEF DESCRIPTION OF DRAWINGS

Other features, aims and advantages of the invention will become apparent on reading the following detailed description with reference to the appended drawings, which are given by way of nonlimiting example and in which.

DETAILED DESCRIPTION

Figure 1:
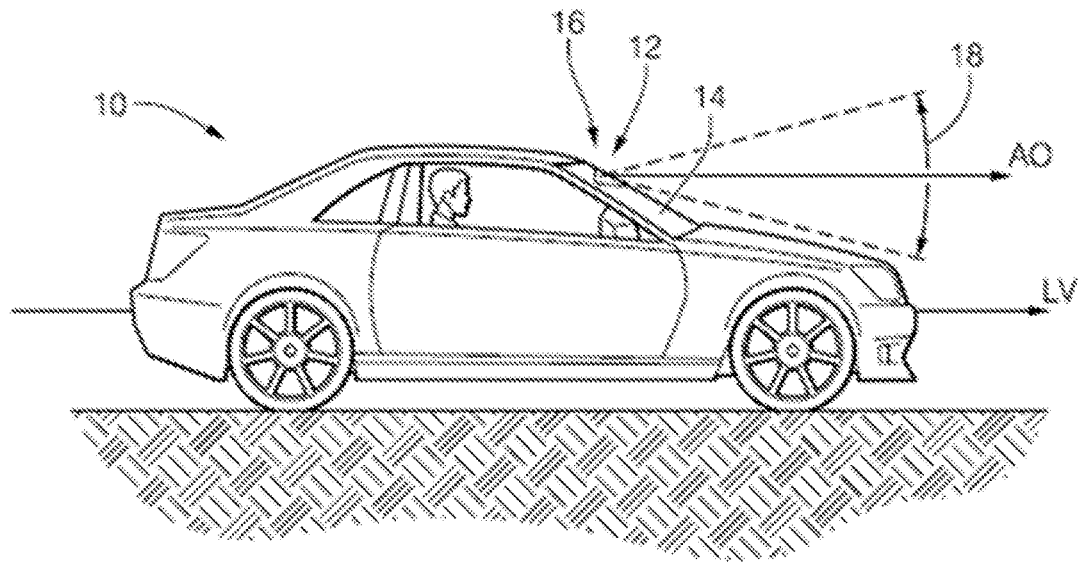
FIG. 1 is a schematic view of a vehicle equipped with the video-camera device according to the invention.

In FIG. 1, a vehicle 10 is equipped with an imaging assembly, denoted a video-camera device 12 below, this assembly/device being suitable for capturing an image of a field of view 18 in proximity to the vehicle 10. In this example the video-camera device 12 is shown as being mounted behind the windscreen 14 of the vehicle 10. The video-camera device 12 comprises a video-camera module 16 that is configured to capture an image of the field of view 18 of the vehicle 10 through a portion of the windscreen 14. The field of view 18 of the vehicle 10 extends horizontally forward from the vehicle 10, along the main optical axis AO of the video camera. The optical axis AO is on the whole parallel to the longitudinal axis LV of the vehicle. The expression "longitudinal axis LV of the vehicle" is understood to mean the axis along which the vehicle 10 extends from back to front and that is on the whole parallel to a flat road on which the vehicle 10 rests. This video-camera device 12 furthermore allows, nonlimitingly, road lanes, direction signs, traffic signs, obstacles, pedestrians, etc. to be detected.

Figure 2:
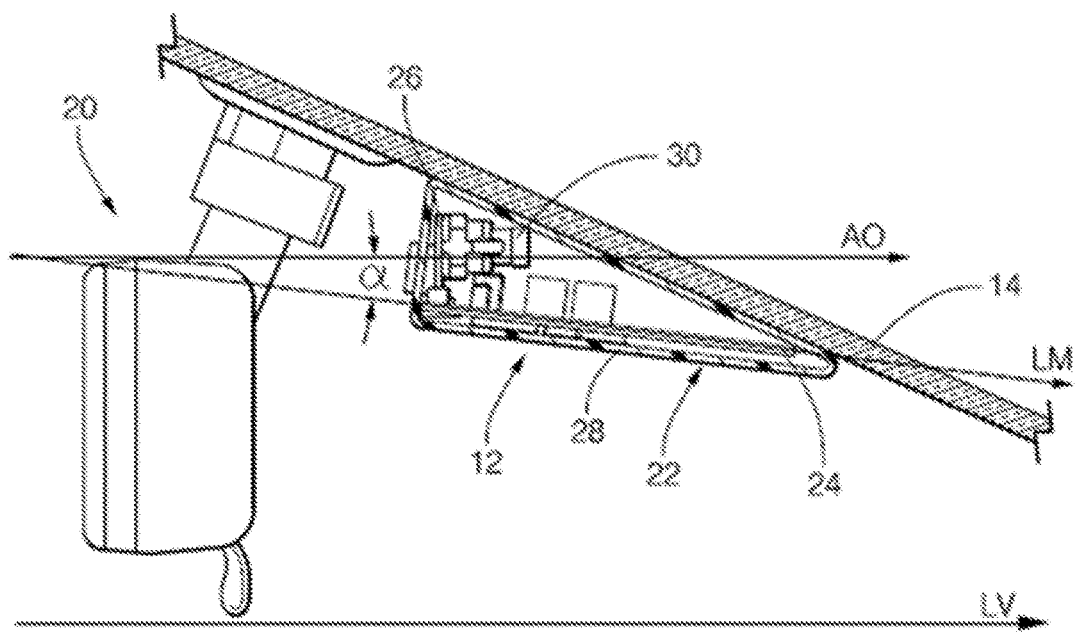
FIG. 2 is a see-through schematic view of the video-camera device according to the invention fastened to the windscreen of a vehicle.

In FIG. 2, the video-camera device 12 is arranged toward the front in the vehicle 10. More particularly, the video-camera device 12 is arranged in the upper middle portion of the windscreen 14, in front of the interior rear-view mirror 20 of the vehicle 10, so that the field of view 18 is in front of the vehicle 10. The video-camera device 12 includes a housing assembly 22 that is fastened to the windscreen 14, for example via a frame or a holder that is fastened by an adhesive to the windscreen 14 or fastening elements.

The video-camera device 12 comprises a first printed-circuit board, called the motherboard 24, and a second printed-circuit board, called the daughterboard 26. The motherboard 24 is arranged flat on a bottom wall 28 of the housing assembly 22 along a longitudinal axis called the longitudinal axis LM of the motherboard. The daughterboard 26 is arranged on the motherboard 24 so as to be perpendicular to the longitudinal axis LV of the vehicle.

The daughterboard 26 is equipped with the video-camera module 16 comprising the objective 30 of the video camera. The particularity of the invention resides in the fact that the optical axis AO of the objective 30 of the video-camera module 16 is parallel to the longitudinal axis LV of the vehicle whereas the motherboard 24 has an inclination by an angle α to the longitudinal axis LV of the vehicle. In other words, the optical axis AO has an inclination of an angle α to the longitudinal axis LM of the motherboard.

Figure 3:
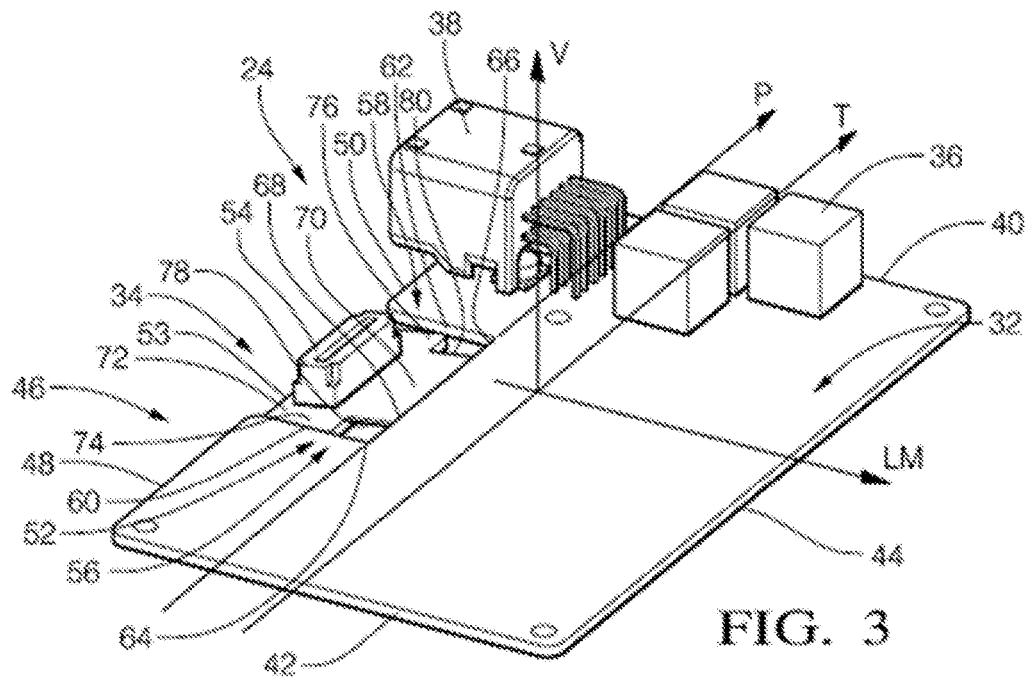
FIG. 3 is a perspective schematic view of the motherboard of the video-camera device according to the invention.

In FIG. 3, the motherboard 24, which is of rectangular shape on the whole, comprises a main segment 32 and a secondary segment 34. The motherboard 24 is therefore a single printed-circuit board in which the secondary segment 34 is made of the same material as and integrally formed with the main segment 32.

The main segment 32 is the segment of largest area on which electronic components 36 allowing images captured by the video-camera module 16 to be processed are arranged. The main segment 32 is also equipped with a connector 38 allowing the video-camera device 12 to be electrically connected to the electrical network of the vehicle 10 and therefore in particular to safety systems of the vehicle 10, such as for example an emergency braking system. The shape of the main segment 32 is rectangular on the whole. The main segment 32 therefore comprises two parallel boundaries 40, 42 extending parallel to the longitudinal axis LM of the motherboard and also two other boundaries 44, 46 extending along a transverse axis T perpendicular to the longitudinal axis LM of the motherboard. One of the two transverse boundaries 46 of the main segment 32 comprises a discontinuity dividing this boundary 46 into a first boundary segment 48 and a second boundary segment 50. The discontinuity is a notch 52 that is also of rectangular shape on the whole.

The secondary segment 34 is arranged in the notch 52. The secondary segment 34 comprises a transverse boundary 53 that is aligned, transversely, with the first boundary segment 48 and the second boundary segment 50. A right-angle connector 54 intended to receive the daughterboard 26 is arranged parallelly and in proximity to the transverse boundary 53 of the secondary segment 34. The secondary segment 34 is bounded on either side by a first slot 56 and a second slot 58 that extend from the transverse boundary 53 of the secondary segment 34 on each side of the right-angle connector 54 to a first end 64 and a second end 66. The first end 64 and the second end 66 are equidistant from the transverse boundary 53 of the secondary segment 34. The first slot 56 and the second slot 58 are on the whole perpendicular to the transverse boundary 53 of the secondary segment 34. A rectilinear border 68 extending from the first end 64 to the second end 66 also bounds the secondary segment 34 of the main segment 32. The rectilinear border 68 is parallel to the transverse boundary 53 of the secondary segment 34.

The first slot 56 and the second slot 58 extend perpendicularly to the first boundary segment 48 and to the second boundary segment 50 so as to form two other boundaries of the main segment 32. These two boundaries will be referred to as the internal boundaries 60, 62 of the main segment 32. The first slot 56 and the second slot 58 are of similar length along the longitudinal axis LM of the motherboard.

In other words, this means that the secondary segment 34 is a segment of the motherboard 24 partially surrounded by a void; the void including the first slot 56 and the second slot 58, and the free space beyond the area of the motherboard 24. The rectilinear border 68 defines a junction between the main segment 32 and the secondary segment 34.

Such as shown, the void and the rectilinear border 68 make it possible to make the secondary segment 34 inclinable. More precisely, the secondary segment 34 is inclined relatively to the surface of the main segment 32 about a pivot axis P. The rectilinear border 68 defines the pivot axis P of the secondary segment 34, thus allowing it to be inclined. The possible inclination of the secondary segment 34 is provided in order to allow the inclination of the optical axis AO of the video-camera module 16 to be adjusted when the daughterboard 26 is mounted in the right-angle connector 54.

Furthermore, in FIG. 3, the secondary segment 34 comprises an intermediate segment 70 and a connecting segment 72. The intermediate segment 70 and the connecting segment 72 extend one after the other, respectively from the rectilinear border 68 to the transverse boundary 53 of the secondary segment 34. The intermediate segment 70, which is of rectangular shape on the whole, is therefore the portion of the secondary segment 34 comprised between the connecting section 72 and the rectilinear border 68.

The connecting segment 72, which is of rectangular shape on the whole, includes the right-angle connector 54 intended to receive the daughterboard 26. The connecting segment 72 comprises a first lateral boundary 74 and a second lateral boundary 76 on either side of the right-angle connector 54. These two lateral boundaries 74, 76 are parallel to the internal boundaries 60, 62 of the main segment 32. These two lateral boundaries 74, 76 are separated from the internal boundaries 60, 62 by the first slot 56 and the second slot 58.

The intermediate segment 70 also comprises a first lateral boundary 78 and a second lateral boundary 80, these two lateral boundaries 78, 80 being parallel to the internal boundaries 60, 62 of the main segment 32. However, the lateral boundaries 78, 80 of the intermediate segment 70 are further from the internal boundaries 60, 62 than the lateral boundaries 74, 76 of the connecting section 72. The lateral boundaries 78, 80 of the intermediate segment 70 are on the whole spaced apart from the internal boundaries 60, 62 by the same distance.

The arrangement of the secondary segment 34 described with reference to FIG. 3 is nonlimiting. Specifically, for example, the secondary segment 34 of the motherboard may also be located in a corner of the motherboard 24. The secondary section 34 may also be arranged in a zone internal to the perimeter of the motherboard 24. In these two examples, the inclination of the secondary segment 34 relatively to the surface of the main segment 32 is obtained via a void partially surrounding the secondary segment 34 and the arrangement of a border 68 defining the secondary segment 34 with the main segment 32.

Figure 4:
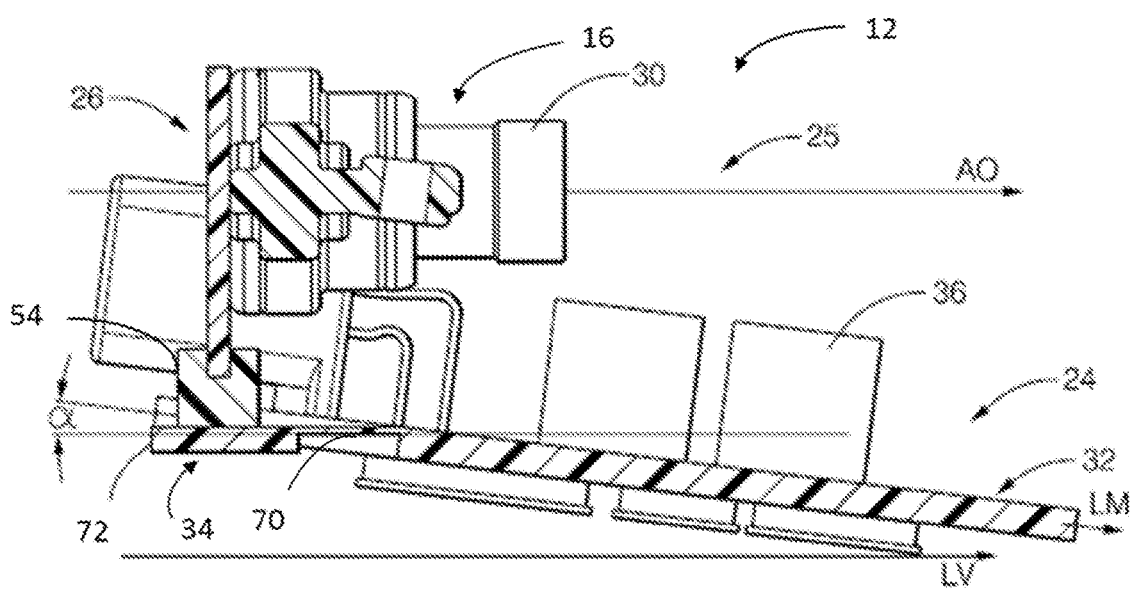
FIG. 4 is a schematic view of a cross section cut along a vertical axis of the daughterboard assembled with the motherboard according to the invention.

In FIG. 4, the daughterboard 26, equipped with the video-camera module 16, is arranged in the right-angle connector 54. More precisely, the end of the daughterboard 26 inserted into the right-angle connector 54 includes electrical terminals (not shown) via which electrical signals are passed from the video-camera module 16 to the electronic components 36 of the motherboard allowing the processing of the captured images. The assembly including the daughterboard 26 and motherboard 24 assembled forms a single electronic device 25 in the video-camera device 12. The optical axis AO of the objective 30 of the video-camera module 16 is perpendicular to the daughterboard 26. The daughterboard 26 is perpendicular to the secondary segment 34 of the motherboard 24. The surface of the secondary segment 34 is inclined at an angle α relatively to the surface of the main section 32 about the pivot axis P. The intermediate segment 70 has a reduced thickness with respect to the thickness of the main segment. According to this embodiment, the connecting segment 72 is of the same thickness as the main segment 32. Restricting the thickness of the intermediate segment 70 with respect to the main segment 32 makes it possible to guarantee a larger inclination than is possible with an equivalent thickness. The connecting segment 72 must have a sufficient rigidity and a sufficient thickness to support the weight of the daughterboard 26.

Alternatively, the main segment 32 and the connecting segment 72 may have different thicknesses, the intermediate segment 70 having the most reduced thickness in order to allow easy inclination of the secondary segment 34 about the pivot axis P.

According to one particular embodiment, the motherboard 24 is a printed circuit board comprising a plurality of layers. Preferably, the intermediate segment 70 includes an insulating layer and a copper layer, the connecting segment 72 and the main segment 32 including the insulating layer and the copper layer of the intermediate segment 70 and at least one additional copper layer and one additional insulating layer.

Figure 5:
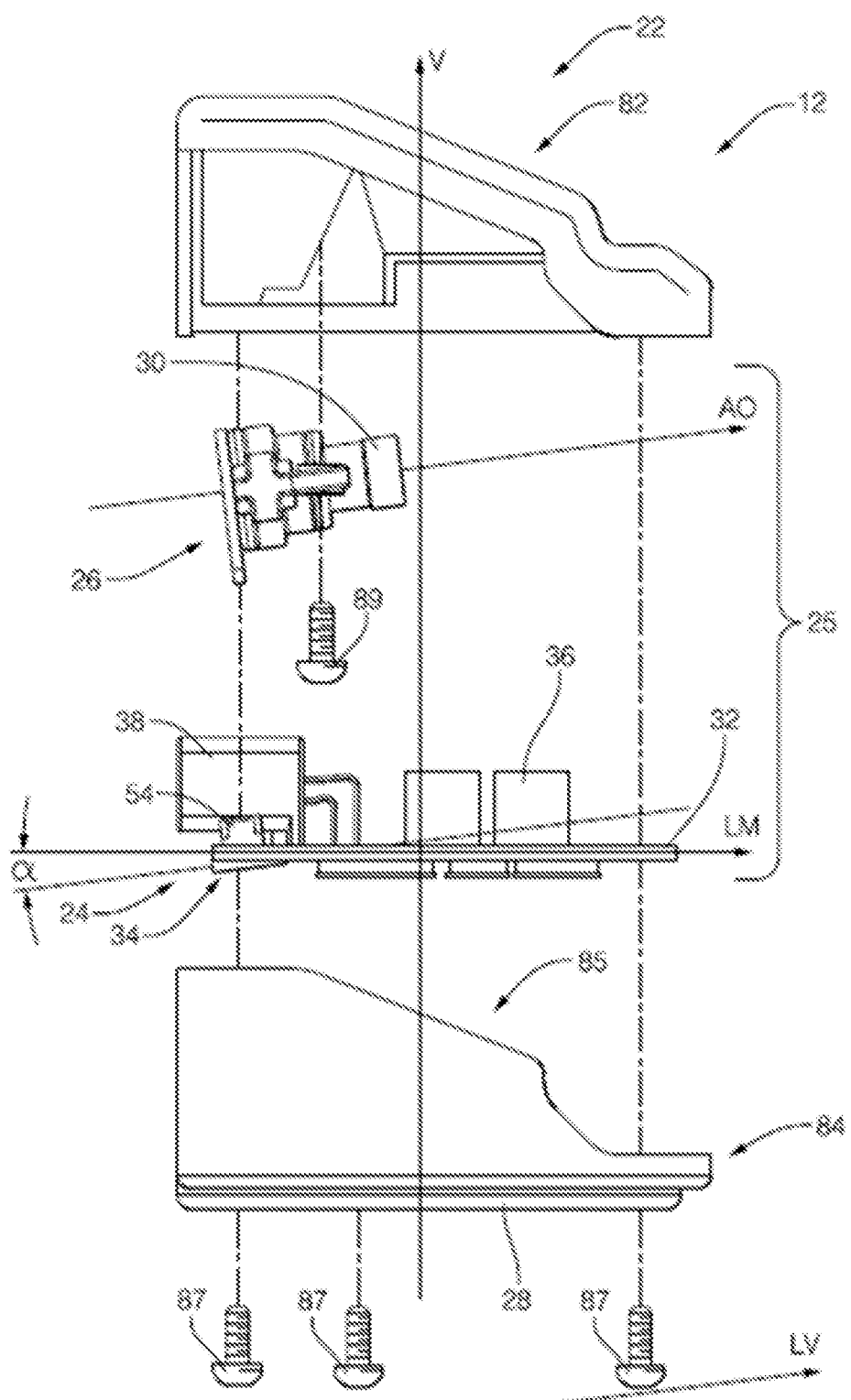
FIG. 5 is an exploded schematic view of the video-camera device.

In FIG. 5, a method for assembling the video-camera device 12 is shown. The video-camera device 12 is provided with the electronic device 25 comprising the motherboard 24 assembled with the daughterboard 26, and the housing assembly 22.

The housing assembly 22 comprises two elements: an upper cover 82 and a lower housing 84. The upper cover 82 generally makes contact with the windscreen 14 of the vehicle 10. The upper cover 82 comprises an aperture (not shown) through which the objective 30 of the video-camera module 16 may capture an image of the field of view 18 of the vehicle 10; the optical axis AO of the video-camera module 16 being parallel to the longitudinal axis LV of the vehicle.

The lower housing 84 is a housing comprising an upper aperture 85 intended to be closed by the upper cover 82 and a bottom wall 28 intended to be used to arrange the motherboard 24.

A first assembling step consists in mounting the electronic components 36 and the connectors 38, 54 on the motherboard 24. Another step consists in mounting the video-camera module 16 on the daughterboard 26 so that the main optical axis AO is orthogonal to the surface of the daughterboard 26.

The following step consists in fastening the daughterboard 26 to the upper cover 82, the objective 30 of the video-camera module 16 being arranged through the aperture. The daughterboard 26 is therefore secured to the upper cover 82.

More particularly, the video-camera module 16 is fastened by screwing to the upper cover 82 in order to set the orientation of the optical axis AO so that, during the mounting of the video-camera device 12 on the windscreen 14 of the vehicle 10, the optical axis AO is on the whole parallel to the longitudinal axis LV of the vehicle.

Next, the motherboard 24 is assembled with the daughterboard 26. In this step, it is necessary to insert the daughterboard 26 into the connecting segment 72 of the secondary segment 3. More particularly, the daughterboard 26 is inserted into the right-angle connector 54, so as to be perpendicular to the surface of the connecting segment 72.

Lastly, the last step consists in closing the housing assembly 22 by assembling the lower housing 84 with the upper cover 82. During this assembling step, the motherboard 24 is arranged on the bottom wall 28 of the lower housing 84. The motherboard is fastened flat to the bottom wall of the lower housing 84, generally resulting in an inclination of an angle α of the secondary segment 34 of the motherboard 24 relatively to the surface of the main section 32 about the pivot axis P. Preferably, such as shown in FIG. 5, the video-camera module 16 is fastened by screwing to the upper cover 82. Furthermore, the motherboard 24 is fastened flat to the bottom wall 28 of the lower housing 84 by screwing. The screwing means are generally screws 87, 89. Tightening of the screws 87 holding the motherboard flat on the housing bottom 28 results in the inclination of an angle α of the secondary segment 34 of the motherboard 24 relatively to the surface of the main segment 32 about the pivot axis P.

The screen-fastening means is not a means limiting the invention. Other fastening means may be envisaged, or even combined together. By way of example, the motherboard 24 may be fastened flat by screwing to the bottom wall 28 of the housing assembly 22, the motherboard 24 being inserted by means of a slide that is made of the same material as and integrally formed with the upper cover 82. The sliding means is inclined with respect to the vertical axis V of the motherboard 24 in order to set the orientation of the optical axis AO so that, during the mounting of the video-camera device 12 on the windscreen 14 of the vehicle 10, the optical axis AO is on the whole parallel to the longitudinal axis LV of the vehicle.

Furthermore, the right-angle connector 54 is not indispensable. Other means allowing the electrical contact between the daughterboard 26 and the motherboard 24, such as a forceful insertion of the end of the daughterboard 26 including the electrical terminals through the connecting zone 72 of the secondary segment 34, are possible.

An alternative assembling method may consist in fastening flat the motherboard 24 to the bottom wall 28 of the lower housing 84 before the assembly of the motherboard 24 with the daughterboard 26. The lower housing 84 is then assembled with the upper cover 82 so as to close the housing assembly 22, the assembled video-camera module 16 and daughterboard 26 having been fastened to the upper cover 82 beforehand.

While this invention has been described in terms of the preferred embodiments thereof, it is not intended to be so limited, but rather only to the extent set forth in the claims that follow.

We claim:

1. A video-camera device comprising:
   a motherboard characterized as rectangular;
   a daughterboard comprising a video-camera module the optical axis of which is perpendicular to a main plane of the daughterboard;
   the motherboard including a main segment characterized as rigid, said main segment comprising image-processing electronic components;
   the motherboard including a secondary segment that is made of the same material as, and integrally formed with, the main segment;
   characterized in that
   the secondary segment is partially surrounded by a void;
   the secondary segment has a rectilinear border defining the junction between the main segment and the secondary segment, the rectilinear border defining a pivot axis of the secondary segment;
   the secondary segment comprises an intermediate segment and a connecting segment;
   the intermediate segment extending between the rectilinear border and the connecting segment;
   the intermediate segment having a reduced thickness with respect to the thickness of the main segment;
   the daughterboard is mounted perpendicularly on the secondary segment in such a way that the secondary segment is inclinable relatively to the surface of the main segment about the pivot axis in order to allow the angle of inclination between the optical axis of the video-camera module and the main segment to be adjusted.

2. The video-camera device according to claim 1, characterized in that the optical axis is perpendicular to the pivot axis.

3. The video-camera device according to claim 1, characterized in that the intermediate segment has a reduced thickness with respect to the thickness of the connecting segment.

4. The video-camera device according to claim 1, characterized in that the secondary segment is bounded by at least one slot extending from a rectilinear edge of the motherboard to the pivot axis of the secondary segment.

5. The video-camera device according to claim 4, characterized in that the secondary segment is bounded by two slots on either side of the secondary segment, the two slots extending from the rectilinear edge of the motherboard to the pivot axis of the secondary segment.

6. The video-camera device according to claim 1, said device being configured to be mounted in the passenger compartment of a vehicle, on the windscreen of the vehicle, characterized in that the video-camera device includes:
   a housing assembly comprising a bottom wall and an upper cover;
   the motherboard fastened flat to the bottom wall of the housing assembly;
   the video-camera module fastened to the upper cover so that the secondary segment of the motherboard is inclined at an angle α relatively to the surface of the main segment about the pivot axis.

7. A method for assembling a video-camera device, said method being characterized in that it includes the steps of:
   providing a motherboard that is rectangular on the whole, including a rigid main segment and a secondary segment that is partially surrounded by a void, and having a rectilinear border defining a junction between the main segment and the secondary segment, the rectilinear border defining a pivot axis of the secondary segment so that the secondary segment is inclinable relatively to the surface of the main segment about the pivot axis;
   producing a connecting segment on the secondary segment, intended for connection of a daughterboard;
   producing the secondary segment comprises an intermediate segment and a connecting segment;
   wherein the intermediate segment extending between the rectilinear border and the connecting segment;
   the intermediate segment having a reduced thickness with respect to the thickness of the main segment;
   providing a daughterboard comprising a video-camera module the optical axis of which is perpendicular to the main plane of the daughterboard;
   providing a housing assembly including an upper cover and a lower housing;
   fastening the video-camera module to the upper cover;
   assembling the motherboard and the daughterboard by connecting the daughterboard orthogonally to the connecting segment;
   assembling the lower housing with the upper cover so as to close the housing assembly;
   fastening flat the motherboard to the bottom wall of the lower housing, the optical axis of the video-camera module being inclined by an angle α relatively to the surface of the main segment of the motherboard.

8. The method for assembling the video-camera device according to claim 7, characterized in that the steps of fastening the motherboard and the video-camera module are screw-fastening steps.

* * * * *